(12) United States Patent
Lee et al.

(10) Patent No.: US 8,692,394 B2
(45) Date of Patent: Apr. 8, 2014

(54) ADHESIVE FOR SEMICONDUCTOR BONDING, ADHESIVE FILM FOR SEMICONDUCTOR BONDING, METHOD FOR MOUNTING SEMICONDUCTOR CHIP, AND SEMICONDUCTOR DEVICE

(75) Inventors: Yangsoo Lee, Osaka (JP); Sayaka Wakioka, Osaka (JP); Atsushi Nakayama, Osaka (JP); Carl Alvin Dilao, Osaka (JP)

(73) Assignee: Sekisui Chemical Co., Ltd., Osaka (JP)

( * ) Notice: Subject to any disclaimer, the term of this patent is extended or adjusted under 35 U.S.C. 154(b) by 0 days.

(21) Appl. No.: 13/499,134

(22) PCT Filed: Mar. 18, 2010

(86) PCT No.: PCT/JP2010/054677
§ 371 (c)(1),
(2), (4) Date: Jul. 11, 2012

(87) PCT Pub. No.: WO2011/040064
PCT Pub. Date: Apr. 7, 2011

(65) Prior Publication Data
US 2012/0267803 A1 Oct. 25, 2012

(30) Foreign Application Priority Data

Sep. 30, 2009 (JP) .................................. 2009-228714
Jan. 21, 2010 (JP) .................................. 2010-011308

(51) Int. Cl.
*H01L 23/58* (2006.01)

(52) U.S. Cl.
USPC .................. 257/798; 257/787; 257/E21.599; 257/E23.003; 257/789; 257/791; 523/440; 523/442; 523/455

(58) Field of Classification Search
USPC .................. 257/787–798, E21.599, E23.003; 523/440–442, 284, 455
See application file for complete search history.

(56) References Cited

U.S. PATENT DOCUMENTS

| | | | | | |
|---|---|---|---|---|---|
| 6,127,460 | A | * | 10/2000 | Kazuto ......................... | 523/443 |
| 6,472,070 | B1 | * | 10/2002 | Muraoka et al. .............. | 428/418 |
| 2002/0058145 | A1 | * | 5/2002 | Kanamaru et al. ............ | 428/413 |
| 2003/0144382 | A1 | * | 7/2003 | Honda et al. .................. | 523/400 |
| 2005/0096417 | A1 | * | 5/2005 | Quackenbush ................ | 524/284 |
| 2009/0184431 | A1 | * | 7/2009 | Sumita et al. ................. | 257/778 |
| 2010/0129045 | A1 | * | 5/2010 | Shibata et al. ................ | 385/141 |
| 2011/0039978 | A1 | * | 2/2011 | Kotani et al. ................. | 523/218 |
| 2011/0065872 | A1 | * | 3/2011 | Taguchi et al. ............... | 525/478 |
| 2012/0326301 | A1 | * | 12/2012 | Wakioka et al. .............. | 257/737 |

FOREIGN PATENT DOCUMENTS

| | | |
|---|---|---|
| JP | 11-012545 A | 1/1999 |
| JP | 2006-245242 A | 9/2006 |
| JP | 2008-133354 A | 6/2008 |
| JP | 2009-124115 A | 6/2009 |
| JP | 2009-161629 A | 7/2009 |

* cited by examiner

*Primary Examiner* — Alexander Sofocleous
*Assistant Examiner* — Ankush Singal
(74) *Attorney, Agent, or Firm* — Novak Druce Connolly Bove + Quigg LLP

(57) ABSTRACT

The present invention is aimed to provide an adhesive for bonding a semiconductor which has high transparency and facilitates recognition of a pattern or position indication on the occasion of semiconductor chip bonding.
The present invention is an adhesive for bonding a semiconductor containing: an epoxy resin; an inorganic filler; and a curing agent, wherein the amount of the inorganic filler in the adhesive is 30 to 70% by weight, the inorganic filler contains a filler A having an average particle size of less than 0.1 μm and a filler B having an average particle size of not less than 0.1 μm and less than 1 μm, and the weight ratio of the filler A to the filler B is 1/9 to 6/4. The present invention is an adhesive for bonding a semiconductor containing: an epoxy resin; an inorganic filler; and a curing agent, wherein difference in refractive index is not more than 0.1 between the epoxy resin and the inorganic filler.

20 Claims, No Drawings

ADHESIVE FOR SEMICONDUCTOR BONDING, ADHESIVE FILM FOR SEMICONDUCTOR BONDING, METHOD FOR MOUNTING SEMICONDUCTOR CHIP, AND SEMICONDUCTOR DEVICE

CROSS REFERENCE TO RELATED APPLICATIONS

This application is a National Phase filing under 35 U.S.C. §371 of PCT/JP2010/054677 filed on Mar. 18, 2010; and this application claims priority to Application No. 2009-228714 filed in Japan on Sep. 30, 2009, and Application No. 2010-011308 filed in Japan on Jan. 21, 2010 under 35 U.S.C. §119; the entire contents of all are hereby incorporated by reference.

TECHNICAL FIELD

The present invention relates to an adhesive for bonding a semiconductor which has high transparency and facilitates recognition of a pattern or position indication on the occasion of semiconductor chip bonding.

BACKGROUND ART

In production of a semiconductor device, a semiconductor chip is adhered and fixed to a substrate or another semiconductor chip in a bonding step. Recently, an adhesive, an adhesive film or the like is likely to be used for bonding a semiconductor chip.

For example, Patent Document 1 discloses an adhesive film for an insulating layer which has a minimum viscosity measured at a heat adhesion temperature by a capillary rheometer method of 100 to 2000 Pa·s in a semiconductor device comprising a semiconductor chip, a flexible wiring substrate, and an insulating layer between them. Patent Document 1 discloses that the adhesive film for an insulating layer disclosed in that document is excellent in film infusion control, heat resistance, and circuit-filling properties.

Meanwhile, semiconductor devices are further reduced in size and further integrated recently, leading to production of, for example, a flip chip having a plurality of protrusions (bumps) as electrodes on the front face and a stacked chip in which a plurality of thinly ground semiconductor chips are stacked. Moreover, production process is further automated for efficient production of such a compact and highly-integrated semiconductor device.

In the recent automated bonding step, a camera recognizes a pattern or position indication on a semiconductor chip to perform alignment of the semiconductor chip. On that occasion, the pattern or position indication is recognized through an adhesive on the semiconductor chip. Therefore, the adhesive used for bonding is required to have a transparency to the extent where the camera can sufficiently recognize the pattern or position indication.

However, a conventional adhesive contains a large amount of fillers for realizing excellent bonding reliability by lowering the linear expansion coefficient of its cured product, causing lowering of the transparency. As a result, recognition of a pattern or position indication with a camera becomes difficult and improvement in productivity of a semiconductor device is problematically disturbed.

PRIOR ART DOCUMENTS

Patent Documents

Patent Document 1: Japanese Kokai Publication No. H11-12545 (JP-A H11-12545)

SUMMARY OF INVENTION

Problems to be Solved by the Invention

The present invention is aimed to provide an adhesive for bonding a semiconductor which has high transparency and facilitates recognition of a pattern or position indication on the occasion of semiconductor chip bonding.

Means for Solving the Problems

The present invention 1 is an adhesive for bonding a semiconductor containing: an epoxy resin; an inorganic filler; and a curing agent, wherein the amount of the inorganic filler in the adhesive is 30 to 70% by weight, the inorganic filler contains a filler A having an average particle size of less than 0.1 μm and a filler B having an average particle size of not less than 0.1 μm and less than 1 μm, and the weight ratio of the filler A to the filler B is 1/9 to 6/4.

The present invention 2 is an adhesive for bonding a semiconductor containing: an epoxy resin; an inorganic filler; and a curing agent, wherein difference in refractive index is not more than 0.1 between the epoxy resin and the inorganic filler.

In an adhesive for bonding a semiconductor, in order to increase the transparency while maintaining a low linear expansion coefficient of its cured product, inorganic filler having an average particle size sufficiently smaller than the wavelength of light is commonly effectively used. However, such inorganic filler increases the viscosity of the adhesive to lower its flowability. Then, there may be problematically a case where the coating property of the adhesive may be lowered or an adhesive layer formed of the adhesive may be less likely to follow a wafer having a protruding electrode on the front face.

To solve such a problem, the present inventors found out that, in an adhesive for bonding a semiconductor containing an epoxy resin, inorganic filler, and a curing agent, adjustment of the inorganic filler content of the adhesive to a predetermined range and use of two kinds of inorganic fillers each having a predetermined average particle size at a predetermined weight ratio realizes excellent coating property, high bonding reliability, and high transparency at the same time. The present inventors found out that such an adhesive for bonding a semiconductor facilitates recognition of a pattern or position indication with a camera on the occasion of semiconductor chip bonding owing to its high transparency. Consequently, the present inventors completed the present invention 1.

The refractive index of resins commonly used for an adhesive for bonding a semiconductor, such as a novolac-type epoxy resin, a bisphenol-type epoxy resin, an acrylic resin having an epoxy group, is around 1.4 to 1.6. On the other hand, the refractive index of silica that is commonly used as inorganic filler is around 1.2 to 1.4. The present inventors noted the difference in the refractive index between them.

The present inventors found out the following fact. Namely, in an adhesive for bonding a semiconductor containing an epoxy resin, inorganic filler, and a curing agent, scattering of light transmitting the adhesive can be suppressed by adjustment of the difference in the refractive index between the epoxy resin and the inorganic filler to not more than 0.1. Then, an adhesive for bonding a semiconductor having a high transparency is obtained. Use of such an adhesive for bonding a semiconductor facilitates recognition of a pattern or position indication on the occasion of semiconductor chip bonding. Consequently, the present inventors completed the present invention 2.

The present inventions 1 and 2 are described in detail in the following.

Further, in the descriptions below, when the contents are common to the present inventions 1 and 2, they will be simply described using an adjective phrase of "the present invention".

The adhesive for bonding a semiconductor of the present invention contains an epoxy resin.

The epoxy resin is not particularly limited, and preferably contains an epoxy resin having a polycyclic hydrocarbon skeleton in the main chain. An adhesive for bonding a semiconductor containing the epoxy resin having a polycyclic hydrocarbon skeleton in the main chain gives a cured product that is rigid enough to disturb molecular motion therein. Such a cured product is excellent in mechanical strength and heat resistance. Moreover, the cured product is also excellent in damp proofness because of its low water absorbability.

The epoxy resin having a polycyclic hydrocarbon skeleton in the main chain is not particularly limited, and examples thereof include: epoxy resins having a dicyclopentadiene skeleton (hereinafter, also referred to as dicyclopentadiene-type epoxy resins) such as dicyclopentadiene dioxide and a phenol novolac epoxy resin having a dicyclopentadiene skeleton; epoxy resins having a naphthalene skeleton (hereinafter, also referred to as naphthalene-type epoxy resins) such as 1-glycidyl naphthalene, 2-glycidyl naphthalene, 1,2-diglycidyl naphthalene, 1,5-diglycidyl naphthalene, 1,6-diglycidyl naphthalene, 1,7-diglycidyl naphthalene, 2,7-diglycidyl naphthalene, triglycidyl naphthalene, 1,2,5,6-tetraglycidyl naphthalene; tetrahydroxy phenylethane-type epoxy resins, tetrakis(glycidyloxyphenyl)ethane, and 3,4-epoxy-6-methylcyclohexylmethyl-3,4-epoxy-6-methylcyclohexane carbonate. Among these, dicyclopentadiene-type epoxy resins and naphthalene-type epoxy resins are preferable.

Each of these epoxy resins having a polycyclic hydrocarbon skeleton in the main chain may be used alone, or two or more of these may be used in combination. Moreover, multipurpose epoxy resins such as bisphenol A-type epoxy resins and bisphenol F-type epoxy resins may be used in combination.

The naphthalene-type epoxy resin contains a compound having a structure represented by Formula (1). The compound represented by Formula (1) reduces the linear expansion coefficient of a cured product of an obtainable adhesive for bonding a semiconductor to increase the heat resistance and adhesion property of the cured product. As a result, higher bonding reliability is realized.

[Chem. 1]

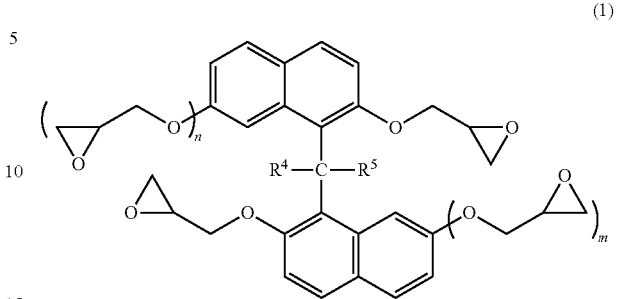

(1)

In Formula (1), $R^4$ and $R^5$ each represent a hydrogen atom, a halogen atom, an alkyl group, an aryl group, or a phenyl group, and n and m each represent 0 or 1.

In the case where the epoxy resin contains a compound represented by Formula (1), the amount of the compound in the epoxy resin is not particularly limited. The preferable lower limit thereof is 3% by weight and the preferable upper limit thereof is 90% by weight. If the amount of the compound represented by Formula (1) is less than 3% by weight, the linear expansion coefficient of a cured product of an obtainable adhesive for bonding a semiconductor may not be sufficiently lowered and the adhesion force may be lowered. If the amount of the compound represented by Formula (1) is more than 90% by weight, phase separation may be caused between the compound and other components, leading to a case where the adhesive for bonding a semiconductor has lowered coating property or increased water absorbability. The lower limit of the amount of the compound represented by Formula (1) in the epoxy resin is more preferably 5% by weight and the upper limit thereof is more preferably 80% by weight.

The adhesive for bonding a semiconductor of the present invention preferably further contains a polymer compound. The polymer compound provides an obtainable adhesive for bonding a semiconductor with film forming property or flexibility. As a result, an adhesive for bonding a semiconductor excellent in bonding reliability is obtained.

The polymer compound is not particularly limited, and is preferably a polymer compound having a functional group reactive with an epoxy resin.

The polymer compound having a functional group reactive with an epoxy resin is not particularly limited, and examples thereof include polymer compounds having an amino group, a urethane group, an imide group, a hydroxyl group, a carboxyl group, or an epoxy group. Among these, a polymer compound having an epoxy group is preferable.

In the case where the adhesive for bonding a semiconductor of the present invention contains the epoxy resin having a polycyclic hydrocarbon skeleton in the main chain and the polymer compound having an epoxy group, a cured product of the adhesive is excellent in mechanical strength, heat resistance, and damp proofness, which are derived from the epoxy resin having a polycyclic hydrocarbon skeleton in the main chain, and is excellent in flexibility, which is derived from the polymer compound having an epoxy group. Further, the cured product is excellent in thermal shock cycle resistance, solder reflow resistance, dimension stability and the like, realizing high bonding reliability and high conduction reliability.

The polymer compound having an epoxy group is not particularly limited as long as it is a polymer compound having an epoxy group at a terminal and/or in a side chain (pendant position). Examples thereof include an epoxy group-containing acrylic rubber, an epoxy group-containing butadiene rubber, a bisphenol-type high molecular weight epoxy resin, an epoxy group-containing phenoxy resin, an epoxy group-containing acrylic resin, an epoxy group-containing urethane resin, and an epoxy group-containing polyester resin. Each of these polymer compounds having an epoxy group may be used alone, or two or more of these may be used in combination. Among these, an epoxy group-containing acrylic resin is preferable because it contains a lot of epoxy groups to further enhance the mechanical strength and thermal resistance of a cured product of an obtainable adhesive for bonding a semiconductor.

The polymer compound may have a photocurable functional group, in addition to the functional group reactive with an epoxy resin.

The polymer compound having the photocurable functional group provides an obtainable adhesive for bonding a semiconductor with photocurability. Such an adhesive can be semi-cured by photoirradiation. The adhesion force or bonding force of an adhesive layer formed of the adhesive can be controlled by photoirradiation.

The photocurable functional group is not particularly limited, and examples thereof include an acrylic group and a methacrylic group.

The weight average molecular weight of the polymer compound is not particularly limited. The preferable lower limit thereof is 10 thousand and the preferable upper limit thereof is one million. If the weight average molecular weight of the polymer compound is less than 10 thousand, an obtainable adhesive for bonding a semiconductor may give a cured product having insufficient adhesion force or may be hardly filmed on the occasion of filming thereof. Further, the film forming property of the adhesive for bonding a semiconductor may be insufficient to fail to sufficiently enhance the flexibility of the cured product. If the weight average molecular weight of the polymer compound is more than one million, an obtainable adhesive for bonding a semiconductor may have lowered surface wettability in the bonding process, resulting in the lowered adhesion strength.

In the case where the adhesive for bonding a semiconductor of the present invention contains the polymer compound, the amount of the polymer compound is not particularly limited. The preferable lower limit is 20 parts by weight and the preferable upper limit is 100 parts by weight, per 100 parts by weight of the epoxy resin. If the amount of the polymer compound is less than 20 parts by weight, a cured product of an obtainable adhesive for bonding a semiconductor may have lowered flexibility, failing to achieve high bonding reliability and high conduction reliability. If the amount of the polymer compound is more than 100 parts by weight, a cured product of an obtainable adhesive for bonding a semiconductor may have low mechanical strength, low heat resistance, and low damp proofness, failing to achieve high bonding reliability and high conduction reliability.

The adhesive for bonding a semiconductor of the present invention contains an inorganic filler.

The inorganic filler lowers the linear expansion coefficient of a cured product of an obtainable adhesive for bonding a semiconductor, realizing high bonding reliability.

The adhesive for bonding a semiconductor of the present invention 1 contains a filler A having an average particle size of less than 0.1 μm and a filler B having an average particle size of not less than 0.1 μm and less than 1 μm as inorganic fillers.

Such two kinds of inorganic fillers suppress increase in the viscosity of an obtainable adhesive for bonding a semiconductor and reduction in the flowability caused by such increase in the viscosity to enhance the coating property, while maintaining high bonding reliability. At the same time, the transparency of the adhesive is increased to facilitate recognition of a pattern or position indication with a camera on the occasion of semiconductor chip bonding. Accordingly, the productivity of a semiconductor device is improved.

Moreover, suppression of increase in the viscosity of the adhesive for bonding a semiconductor and reduction in the flowability caused by such increase in the viscosity allows an adhesive layer formed of the adhesive to be more likely to follow a wafer having a protruding electrode on the front face.

If the filler A has an average particle size of not less than 0.1 μm, an obtainable adhesive for bonding a semiconductor may have lowered transparency, resulting in hard recognition of a pattern or position indication with a camera on the occasion of semiconductor chip bonding. The filler A preferably has an average particle size of less than 0.08 μm.

If the filler B has an average particle size of less than 0.1 μm, an obtainable adhesive for bonding a semiconductor may have lowered bonding reliability and increased viscosity to lower the flowability. Such an adhesive may have lowered coating property, causing a case where an adhesive layer formed of the adhesive is less likely to follow a wafer having a protruding electrode on the front face. If the filler B has an average particle size of more than 1 μm, an obtainable adhesive for bonding a semiconductor has lowered transparency, resulting in hard recognition of a pattern or position indication with a camera on the occasion of semiconductor chip bonding.

The average particle size of the filler B is preferably not less than 0.15 μm. The average particle size of the filler B is preferably less than 0.8 μm.

The term "the average particle size" herein refers to the average particle size obtained from the measurement result of the volume-weighted particle size distribution measured with use of a laser diffraction particle size distribution measuring apparatus.

The lower limit of the weight ratio of the filler A to the filler B is preferably 1/9, and the upper limit thereof is preferably 6/4. If the weight ratio of the filler A to the filler B is less than 1/9, an obtainable adhesive for bonding a semiconductor may have lowered transparency, resulting in hard recognition of a pattern or position indication with a camera on the occasion of semiconductor chip bonding. If the weight ratio of the filler A to the filler B is more than 6/4, an obtainable adhesive for bonding a semiconductor may have lowered bonding reliability and increased viscosity to lower the flowability. Such an adhesive may have lowered coating property, causing a case where an adhesive layer formed of the adhesive is less likely to follow a wafer having a protruding electrode on the front face.

The lower limit of the weight ratio of the filler A to the filler B is more preferably 2/8, and the upper limit thereof is more preferably 5/5.

The inorganic filler used in the adhesive for bonding a semiconductor of the present invention 1 is not particularly limited as long as the average particle size and the weight ratio are each in the above range. Examples thereof include silica, alumina, aluminum nitride, boron nitride, silicon nitride, silicon carbide, magnesium oxide, and zinc oxide. Examples of the inorganic filler also include oxides of silicon, titanium, aluminum, calcium, boron, magnesium and zirconium, and composites of these. Specific examples of the composites include a silicon-aluminum-boron complex oxide, a silicon-titanium complex oxide, and a silica-titania complex oxide. In particular, spherical silica is preferable because of its excellent sliding property.

The spherical silica further enhances the bonding reliability, further suppresses increase in the viscosity and reduction in the flowability caused by such increase in the viscosity, and further improves the coating property of an obtainable adhesive for bonding a semiconductor. Use of the spherical silica also allows an adhesive layer formed of the adhesive to be more likely to follow a wafer having a protruding electrode on the front face.

In the adhesive for bonding a semiconductor of the present invention 2, difference in refractive index is not more than 0.1 between the epoxy resin and the inorganic filler. Such inorganic fillers secure the mechanical strength of a cured product of an obtainable adhesive for bonding a semiconductor without lowering its transparency, and lower the linear expansion coefficient to realize high bonding reliability. If the difference in refractive index between the epoxy resin and the inorganic filler is more than 0.1, scattering of light transmitting an obtainable adhesive for bonding a semiconductor is increased to lower the transparency of the adhesive, resulting in hard recognition of a pattern or position indication with a camera on the occasion of semiconductor chip bonding.

The difference in refractive index between the epoxy resin and the inorganic filler is preferably not more than 0.05.

The inorganic filler used for the adhesive for bonding a semiconductor of the present invention 2 is not particularly limited as long as the difference in refractive index between the inorganic filler and the epoxy resin is not more than 0.1. The inorganic filler is preferably at least one selected from the group consisting of oxides of silicon, titanium, aluminum, calcium, boron, magnesium and zirconium, and composites of these.

Among these, a silicon-aluminum-boron complex oxide, a silicon-titanium complex oxide, and a silica-titania complex oxide are preferable because their properties are similar to those of silica that is commonly used as inorganic filler.

The average particle size of the inorganic filler used for the adhesive for bonding a semiconductor of the present invention 2 is not particularly limited. The preferable lower limit thereof is 0.1 μm and the preferable upper limit thereof is 30 μm. If the average particle size of the inorganic filler is less than 0.1 μm, filling of the adhesive for bonding a semiconductor with such inorganic filler may be difficult or an obtainable adhesive for bonding a semiconductor may have lowered flowability to lower its adhesion performance. If the average particle size of the inorganic filler is more than 30 μm, an obtainable adhesive for bonding a semiconductor may have lowered transparency, resulting in hard recognition of a pattern or position indication with a camera on the occasion of semiconductor chip bonding. In addition, if the average particle size of the inorganic filler is more than 30 μm, bonding failure of the electrode may be caused because of the large average particle size of the inorganic filler.

In particular, an inorganic filler having an average particle size of 0.5 to 5 μm may further increase the transparency of the adhesive for bonding a semiconductor. Moreover, an inorganic filler having an average particle size in the nanometer range may be used as the inorganic filler according to need.

The inorganic filler used for the adhesive for bonding a semiconductor of the present invention is preferably surface treated with a coupling agent.

Surface treatment suppresses aggregation of the inorganic filler to enhance affinity with resins such as the epoxy resin. This further increases the bonding reliability, suppresses increase in the viscosity and reduction in the flowability caused by such increase in the viscosity, and further improves the coating property of an obtainable adhesive for bonding a semiconductor. This also allows an adhesive layer formed of the adhesive for bonding a semiconductor to be more likely to follow a wafer having a protruding electrode on the front face.

The coupling agent is not particularly limited, and examples thereof include silane coupling agents, titanium coupling agents, and aluminum coupling agents. Among these, silane coupling agents are preferable from the standpoint of the affinity and dispersibility with the epoxy resin.

The silane coupling agents are not particularly limited, and examples thereof include a vinyl silane, an epoxy silane, a styryl silane, a (meth)acryloxy silane, an amino silane, a ureido silane, a mercapto silane, an imidazole silane, an isocyanate silane, and an alkoxy silane. Among these, an alkoxy silane is preferable.

The alkoxy silane is not particularly limited, and phenyltrimethoxysilane and phenyltriethoxysilane are particularly preferable.

Each of these coupling agents may be used alone, or two or more of these may be used in combination.

The amount of the inorganic filler in the adhesive for bonding a semiconductor of the present invention is not particularly limited. The preferable lower limit thereof is 30 parts by weight and the preferable upper limit thereof is 350 parts by weight, for each 100 parts by weight of the epoxy resin. If the amount of the inorganic filler is less than 30 parts by weight, there may be a case where the sufficient mechanical strength of a cured product of an obtainable adhesive for bonding a semiconductor is not secured, or the linear expansion coefficient is not sufficiently lowered. If the amount of the inorganic filler is more than 350 parts by weight, an obtainable adhesive for bonding a semiconductor may have increased viscosity and lowered surface wettability in the bonding process, resulting in the lowered adhesion strength. The lower limit of the amount of the inorganic filler for each 100 parts by weight of the epoxy resin is more preferably 40 parts by weight and still more preferably 60 parts by weight. The upper limit thereof is more preferably 225 parts by weight, still more preferably 150 parts by weight, and further preferably 120 parts by weight.

The preferable lower limit of the amount of the inorganic filler in the adhesive layer is 10% by weight and the preferable upper limit thereof is 70% by weight. If the amount of the inorganic filler in the adhesive layer is less than 10% by weight, the linear expansion coefficient of a cured product of an obtainable adhesive layer may be increased to be less likely to realize high bonding reliability. If the amount of the inorganic filler in the adhesive layer is more than 70% by weight, a cured product of an obtainable adhesive layer may fail to relieve a thermal stress because of its increased elasticity to be less likely to realize high bonding reliability. Moreover, there may be a case where increase in the viscosity of an adhesive solution for forming the adhesive layer and reduction in the flowability caused by such increase in the viscosity may not be sufficiently suppressed. The lower limit of the amount of the inorganic filler in the adhesive layer is more preferably 20% by weight and the upper limit thereof is more preferably 60% by weight. The lower limit is still more preferably 30% by weight, and the upper limit is still more preferably 55% by weight. The lower limit is particularly preferably 40% by weight.

The adhesive for bonding a semiconductor of the present invention contains a curing agent.

The curing agent is not particularly limited, and examples thereof include thermosetting acid anhydride curing agents (e.g. trialkyl tetrahydro phthalic anhydride), phenol-type curing agents, amine-type curing agents, latent curing agents (e.g. dicyandiamide), and cationic catalyst-type curing agents. Each of these curing agents may be used alone, or two or more of these may be used in combination. Among these, the acid anhydride curing agents are preferable.

The acid anhydride curing agent neutralizes the acidity of a cured product of an obtainable adhesive for bonding a semiconductor to enhance the reliability of an electrode. Moreover, since the thermosetting rate of the acid anhydride curing agent is high, formation of a void in the cured product of the obtainable adhesive is effectively reduced, realizing high bonding reliability.

As described later, in the case where an imidazole compound that is liquid at room temperature is used as a curing accelerator, combination use of an acid anhydride having a bicyclo skeleton as a curing agent realizes high thermosetting property, excellent storage stability, and excellent heat stability at the same time. This is owing to the acid anhydride having a bicyclo skeleton that is sterically bulky which presumably suppresses the reactivity of the adhesive in the curing reaction. In addition, since the acid anhydride having a bicyclo skeleton is highly soluble in the epoxy resin, the transparency of the adhesive for bonding a semiconductor of the present invention is further enhanced. Moreover, use of the acid anhydride having a bicyclo skeleton allows a cured product of the adhesive to exert excellent mechanical strength, heat resistance, and electric properties.

The acid anhydride having a bicyclo skeleton is not particularly limited, and is preferably a compound having a structure represented by Formula (a).
[Chem. 2]

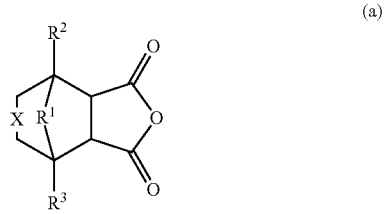

(a)

In Formula (a), X represents a linking group of a single or double bond, $R^1$ represents a methylene or ethylene group, $R^2$ and $R^3$ each represent a hydrogen atom, a halogen group, an alkoxy group, or a hydrocarbon group.

Specific examples of the compound represented by Formula (a) include nadic anhydride and nadic methyl anhydride. Each of these may be used alone, or two or more of these may be used in combination.

Commercial products of the acid anhydride having a bicyclo skeleton is not particularly limited, and examples thereof include YH-307 and YH-309 (both produced by Japan Epoxy resin Co., Ltd.) and RIKACID HNA-100 (produced by New Japan Chemical Co., Ltd.). Each of these may be used alone, or two or more of these may be used in combination.

The amount of the curing agent is not particularly limited. In the case of a curing agent that equimolarly reacts with the functional group in the epoxy resin, the lower limit of the amount of the curing agent relative to the total amount of the epoxy group contained in the adhesive of the present invention is preferably 60 equivalents and the upper limit thereof is preferably 110 equivalents. If the amount of the curing agent is less than 60 equivalents, an obtainable adhesive for bonding a semiconductor may not be sufficiently cured. Even if the amount of the curing agent is more than 110 equivalents, such an excess amount does not especially contribute to enhancement of the curability of the adhesive for bonding a semiconductor. The lower limit of the amount of the curing agent is more preferably 70 equivalents and the upper limit thereof is more preferably 100 equivalents.

The adhesive for bonding a semiconductor of the present invention may further contain a curing accelerator with an aim of adjusting the curing rate and physical properties of a cured product.

The curing accelerator is not particularly limited, and examples thereof include imidazole-type curing accelerators and tertiary amine-type curing accelerators. Each of these curing accelerators may be used alone, or two or more of these may be used in combination. Among these, the imidazole-type curing accelerators are preferable as the reaction systems for adjusting the curing rate and physical properties of a cured product are easily controlled.

The imidazole-type curing accelerators are not particularly limited, and examples thereof include 1-cyanoethyl-2-phenylimidazole in which the 1-position of imidazole is protected with a cyanoethyl group and imidazole-type curing accelerators in which the basicity is protected with isocyanuric acid (trade name "2MA-OK", produced by SHIKOKU CHEMICALS CORPORATION). Each of these imidazole-type curing accelerators may be used alone, or two or more of these may be used in combination.

Moreover, the imidazole-type curing accelerators may contain an imidazole compound that is liquid at room temperature. In the present description, "liquid at room temperature" refers to "liquid at a temperature of 10 to 30° C.".

Commonly, use of the imidazole-type curing accelerator allows thermosetting of an obtainable adhesive for bonding a semiconductor at comparatively low temperatures in a short time. However, many of the imidazole-type curing accelerators are solid at room temperature and finely powdered to be blended, which causes lowering of the transparency. In contrast, use of the imidazole compound that is liquid at room temperature further increases the transparency of an obtainable adhesive for bonding a semiconductor, facilitating recognition of a pattern or position indication with a camera on the occasion of semiconductor chip bonding, for example.

Moreover, the imidazole compound that is liquid at room temperature is preferably used in combination with an acid anhydride having a bicyclo skeleton that is sterically bulky, as mentioned above. This enhances the storage stability and the heat stability of an obtainable adhesive for bonding a semiconductor.

In addition, use of the imidazole compound that is liquid at room temperature does not need a process of finely powdering the imidazole compound. Therefore, production of the adhesive for bonding a semiconductor becomes simpler.

The imidazole compound that is liquid at room temperature is not particularly limited as long as it is liquid at room temperature. Examples thereof include 2-ethyl-4-methylimidazole, 1-methylimidazole, 1-cyanoethyl-2-ethyl-4-methylimidazole, 1-benzyl-2-methylimidazole, 1-cyanoethyl-2-methylimidazole, 1-benzyl-2-ethylimidazole, 1-benyzyl-2-phenylimidazole, 1-cyanoethyl-2-phenyl-4,5-di-(cyanoethoxymethyl)imidazole, 1,8-diazabicyclo(5.4.0)undecene-7, and derivatives of these.

The derivatives are not particularly limited, and examples thereof include salts such as carboxylate, isocyanurate, phosphate, and phosphonate, and adducts with an epoxy compound.

Each of these may be used alone, or two or more of these may be used in combination. Among these, 2-ethyl-4-methylimidazole and its derivatives are preferable.

Commercial products of the imidazole compound that is liquid at room temperature are not particularly limited, and examples thereof include 2E4MZ, 1B2MZ, 1B2PZ, 2MZ-CN, 2E4MZ-CN, 2PHZ-CN, 1M2EZ, 1B2EZ (all produced by SHIKOKU CHEMICALS CORPORATION), EMI24 (produced by Japan Epoxy Resin Co., Ltd.), and Fujicure 7000 (produced by FUJI KASEI CO., LTD.). Each of these may be used alone, or two or more of these may be used in combination.

In the case where the adhesive for bonding a semiconductor of the present invention contains an imidazole compound that is liquid at room temperature, the amount of the imidazole compound is not particularly limited. The lower limit thereof is preferably 5 parts by weight and the upper limit thereof is preferably 50 parts by weight, for each 100 parts by weight of the curing agent. If the amount of the imidazole compound is less than 5 parts by weight, an obtainable adhesive for bonding a semiconductor may require heating at high temperatures for a long time period for thermosetting. If the amount of the imidazole compound is more than 50 parts by weight, an obtainable adhesive for bonding a semiconductor may have lowered storage stability and lowered heat stability.

The lower limit of the amount of the imidazole compound that is liquid at room temperature is more preferably 10 parts by weight and the upper limit thereof is more preferably 30 parts by weight, for each 100 parts by weight of the curing agent.

The adhesive for bonding a semiconductor of the present invention may contain a photopolymerization initiator.

The photopolymerization initiator is not particularly limited, and examples thereof include a photopolymerization initiator that is activated by irradiation with light having a wavelength of 250 to 800 nm. Examples of such a photopolymerization initiator include photo-radical polymerization initiators including: acetophenone derivative compounds such as methoxyacetophenone; benzoin ether-type compounds such as benzoin propyl ether and benzoin isobutyl ether; ketal derivative compounds such as benzyldimethylketal and acetophenonediethylketal; phosphineoxide derivative compounds, bis($\eta$5-cyclopentadienyl)titanocene derivative componds, benzophenone, Michler's ketone, chlorothioxanthone, dodecylthioxanthone, dimethylthioxanthone, diethylthioxanthone, $\alpha$-hydroxycyclohexyl phenyl ketone, and 2-hydroxymethylphenylpropane. Each of these photopolymerization initiators may be used alone, or two or more of these may be used in combination.

The amount of the photopolymerization initiator is not particularly limited. The lower limit thereof is preferably 0.05 parts by weight and the upper limit thereof is preferably 5 parts by weight, for each 100 parts by weight of the photocurable compound. If the amount of the photopolymerization initiator is less than 0.05 parts by weight, an adhesive layer of a film formed with use of an obtainable adhesive for bonding a semiconductor may not be sufficiently semi-cured even with energy irradiation. If the amount of the photopolymerization initiator is more than 5 parts by weight, such an excess amount does not especially contribute to enhancement of photocurability.

The adhesive for bonding a semiconductor of the present invention may further contain common resins such as an acrylic resin, a polyimide, a polyamide, and a phenoxy resin, and may further contain additives such as a silane coupling agent, a titanate coupling agent, a viscosifier, and an antifoaming agent, if needed.

The adhesive for bonding a semiconductor of the present invention preferably has a haze value of not more than 70%.

The haze value in the above range increases the transparency of the adhesive to facilitate recognition of a pattern or position indication with a camera on the occasion of semiconductor chip bonding, leading to improvement in productivity of a semiconductor device.

If the haze value is more than 70%, the transparency of the adhesive is lowered, resulting in hard recognition of a pattern or position indication with a camera on the occasion of semiconductor chip bonding. The adhesive for bonding a semiconductor of the present invention more preferably has a haze value of not more than 60%.

In the present description, the haze value of the adhesive refers to a haze value (%) of an adhesive film for bonding a semiconductor measured by using a haze meter such as "HM-150" produced by MURAKAMI COLOR RESEARCH LABORATORY CO., Ltd. Here, the adhesive film is prepared by sandwiching an adhesive layer (40 µm in thickness) formed of the adhesive between two sheets of PET films (25 µm in thickness).

A method for producing an adhesive for bonding a semiconductor of the present invention is not particularly limited. An exemplary method includes stirring and mixing the epoxy resin, the curing agent, the inorganic filler, and materials added according to need with a homo disper or the like.

Applications of the adhesive for bonding a semiconductor of the present invention is not particularly limited, and may be suitably used as an adhesive for bonding a semiconductor chip to a substrate or another semiconductor chip. In particular, the adhesive is suitably used as an adhesive, an under fill material, or an adhesive also serving as an under fill material, which is used on the occasion of mounting a flip chip having a plurality of protrusions as electrodes on the front face.

Since the adhesive for bonding a semiconductor of the present invention has high transparency, recognition of a pattern or position indication with a camera is facilitated on the occasion of semiconductor chip bonding with use of the adhesive, resulting in improvement in productivity of a semiconductor device.

The adhesive for bonding a semiconductor of the present invention is also suitably used for an adhesive layer of an adhesive film used to bond a semiconductor chip to a substrate or another semiconductor chip, for example.

The present invention also provides an adhesive film for bonding a semiconductor comprising an adhesive layer formed of the adhesive for bonding a semiconductor of the present invention and a substrate layer.

The thickness of the adhesive layer is not particularly limited, and the preferable lower limit is 5 µm and the preferable upper limit is 150 µm. If the thickness of the adhesive layer is less than 5 µm, the adhesion force of a cured product of an obtainable adhesive layer may become insufficient. If the thickness of the adhesive layer is more than 150 µm, such an adhesive layer is too thick to lower the transparency thereof, resulting in hard recognition of a pattern or position indication with a camera on the occasion of semiconductor chip bonding. The lower limit of the thickness of the adhesive layer is more preferably 15 µm and the upper limit thereof is more preferably 50 µm.

The substrate layer is not particularly limited as long as it is transparent to the extent where an effect of the present invention is not disturbed. Examples of the substrate layer include layers made of resins such as polyolefin, acrylate, polycarbonate, vinyl chloride, ABS, polyethylene terephthalate (PET), nylon, urethane, and polyimide.

The thickness of the substrate layer is not particularly limited, and the lower limit thereof is preferably 12 µm and the upper limit thereof is preferably 300 µm. If the thickness of the substrate layer is less than 12 µm, an obtainable adhesive film for bonding a semiconductor may have lowered handleability or fail to exert a sufficient electrode protection effect when used as a non-conductive film functioning as a back grinding tape (BG-NCF). If the thickness of the substrate layer is more than 300 µm, an obtainable adhesive film for bonding a semiconductor may have lowered processability and may be difficult to be rolled up when packaged. Moreover, such an adhesive film may cause greater unevenness in thickness of a wafer when used as a BG-NCF.

In the present description, the non-conductive film functioning as a back grinding tape (BG-NCF) is a film comprising at least a substrate layer and an adhesive layer. This film is attached as a back grinding tape to the front face of a wafer where a plurality of protrusions (bumps) are formed as electrodes. Then, only the substrate layer is removed and the adhesive layer left on the wafer is used on the occasion of bonding the semiconductor chip to a substrate or another semiconductor chip.

A method for producing the adhesive film for bonding a semiconductor of the present invention is not particularly limited. An exemplary method includes diluting the epoxy resin, the inorganic filler, the curing agent, and materials added according to need with an appropriate solvent, stirring and mixing the diluted materials with a homo disper or the like to prepare an adhesive solution containing the adhesive for bonding a semiconductor of the present invention, applying the obtained adhesive solution to the substrate layer, and drying the applied adhesive solution to obtain an adhesive film.

The application method is not particularly limited, and examples thereof include comma coating, gravure coating, and casting. Here, as above mentioned, the adhesive for bonding a semiconductor of the present invention contains a predetermined amount of predetermined inorganic filler so as to suppress increase in the viscosity and reduction in the flowability caused by such increase in the viscosity. Therefore, the adhesive solution containing the adhesive for bonding a semiconductor of the present invention is excellent in the coating property.

Applications of the adhesive film for bonding a semiconductor of the present invention are not particularly limited. The adhesive film is preferably used as an adhesive film used for bonding a semiconductor chip to a substrate or another semiconductor chip, for example. In particular, the adhesive film is more preferably used as an adhesive film, an adhesive film also serving as an underfill material, or a BG-NCF which is used on the occasion of mounting a flip chip having a plurality of protrusions as electrodes on the front face.

In the case where the adhesive film for bonding a semiconductor of the present invention is used as a BG-NCF, dice cutting of a wafer to which an adhesive layer of the adhesive film is attached is carried out. On that occasion, recognition of a cutting plane line indicating a dice-cutting site on the wafer surface is conducted also by a camera through the adhesive layer, in the same manner as recognition of a pattern or position indication. Accordingly, because of the high transparency of the adhesive for bonding a semiconductor of the present invention and the high transparency of the adhesive layer of the adhesive film for bonding a semiconductor of the present invention owing to the high transparency of the adhesive, recognition of the cutting plane line with a camera on the occasion of dice cutting of a semiconductor wafer is also facilitated, leading to improvement in productivity of a semiconductor device.

The present invention also provides a method for mounting a semiconductor chip with use of an adhesive film for bonding a semiconductor of the present invention, the method comprising the steps of: (1) laminating an adhesive layer of the adhesive film and a protruding electrode-forming face of a wafer that has a protruding electrode formed on a front face; (2) grinding the wafer fixed to the adhesive film from the back; (3) removing a substrate layer from the adhesive film laminated on the ground wafer to obtain an adhesive layer-attached wafer; (4) allowing a camera to recognize a cutting plane line on the front face of the adhesive layer-attached wafer automatically and then dice cutting the adhesive layer-attached wafer along the cutting plane line to produce an adhesive layer-attached semiconductor chip; and (5) allowing a camera to recognize a pattern or position indication of the adhesive layer-attached semiconductor chip and a pattern or position indication of a substrate or another semiconductor chip automatically to perform alignment and then adhering the adhesive layer-attached semiconductor chip to the substrate or the another semiconductor chip via the adhesive layer for mounting the semiconductor chip.

Here, examples of the semiconductor chip having a protruding electrode on the front face which is to be mounted by such a method include a flip chip and a TSV.

In the method for mounting a semiconductor chip of the present invention, the step (1) is firstly carried out in which an adhesive layer of the adhesive film for bonding a semiconductor of the present invention is laminated on a protruding electrode-forming face of a wafer that has a protruding electrode on the front face.

The wafer is not particularly limited, and examples thereof include a wafer comprising a semiconductor of silicon, gallium arsenide or the like and having a protruding electrode formed of gold, copper, silver-tin solder, aluminum, nickel, or the like.

The step (1) may be carried out under atmospheric pressure. In order to enhance coherency, the step (1) is preferably carried out under vacuum of about 1 torr.

The lamination method is not particularly limited, and is preferably a method using a laminator.

In the method for mounting a semiconductor chip of the present invention, the step (2) is secondly carried out in which the wafer fixed to the adhesive film for bonding a semiconductor of the present invention is ground from the back. In this step, the wafer is ground to a desired thickness.

Before the step (2), the protruding electrode is buried in the adhesive layer. The pressure applied during the grinding in the step (2) removes the adhesive from the top portion of the protruding electrode. Accordingly, after removal of the substrate layer in a later step, the top portion of the protruding electrode is exposed from the adhesive layer.

The grinding method is not particularly limited and a conventionally known method may be employed. An exemplary method includes grinding with use of a commercial grinder (e.g. "DFG8540" produced by DISCO Corporation) at revolutions of 2400 rpm and a grinding rate of 3 to 0.2 µm/s and then finishing by CMP.

In the method for mounting a semiconductor chip of the present invention, after the step (2) and before the step (3), the adhesive layer may be semi-cured by energy irradiation to the adhesive film for bonding a semiconductor of the present invention laminated on the ground wafer. For semi-curing of the adhesive layer, the adhesive layer needs to contain a compound that is cured by energy irradiation such as photoirradiation.

Semi-curing of the adhesive layer by energy irradiation lowers the adhesion force of the adhesive layer to facilitate removal of the substrate layer in a later step. At this time, the adhesive layer is not completely cured but semi-cured.

Accordingly, the adhesive layer still exerts sufficient adhesion force on the occasion of adhesion to a substrate or another semiconductor chip in a later step. Here, "semi-curing" in the present description refers to curing to a gel fraction of 10 to 60% by weight.

In the method for mounting a semiconductor chip of the present invention, the step (3) is subsequently carried out in which the substrate layer is peeled from the adhesive film for bonding a semiconductor of the present invention laminated on the ground wafer to obtain an adhesive layer-attached wafer.

On this occasion, the adhesive of the adhesive layer tends to be attached to the substrate layer side rather than the surface of the protruding electrode. Accordingly, the amount of the adhesive left on the surface of the protruding electrode is reduced.

In the method for mounting a semiconductor chip of the present invention, the step (4) is then carried out in which a camera automatically recognizes a cutting plane line on the front face of the adhesive layer-attached wafer and dice cutting of the adhesive layer-attached wafer is conducted along the cutting plane line so that an adhesive layer-attached semiconductor chip is produced.

The dice-cutting method is not particularly limited, and a conventionally known method such as cutting with a grind stone and the like may be employed.

In the step (4), the cutting plane line indicating a dice-cutting site on the wafer surface is recognized by a camera through the adhesive layer. In the method for mounting a semiconductor chip of the present invention, the adhesive layer has high transparency to facilitate recognition of the cutting plane line with a camera, leading to improvement in productivity of a semiconductor device.

In the method for mounting a semiconductor chip of the present invention, the step (5) is then carried out in which a camera automatically recognizes a pattern or position indication of the adhesive layer-attached semiconductor chip and a pattern or position indication of a substrate or another semiconductor chip so that alignment of them is performed, and then the adhesive layer-attached semiconductor chip is adhered to the substrate or the another semiconductor chip via the adhesive layer for mounting the semiconductor chip.

In the step (5), the alignment of the pattern or position indication of the adhesive layer-attached semiconductor chip and the pattern or position indication of the substrate or the another semiconductor chip is carried out by a camera through the adhesive layer. In the method for mounting a semiconductor chip of the present invention, the adhesive layer has high transparency to facilitate recognition of a pattern or position indication with a camera, leading to improvement in productivity of a semiconductor device.

In the present description, mounting of a semiconductor chip includes both a case where a semiconductor chip is mounted on a substrate and a case where a semiconductor chip is mounted on one or more semiconductor chip mounted on a substrate.

More stable adhesion is realized by conducting the step (6) of completely curing the adhesive layer by heating after mounting of the semiconductor chip in the step (5).

In the above description, after the step (3) in which the adhesive layer-attached wafer is produced, the step (4) is carried out in which dice cutting is performed on the adhesive layer-attached wafer to produce an adhesive layer-attached semiconductor chip.

As another embodiment, on the adhesive layer-attached wafer obtained in the step (3), another wafer may be stacked via the adhesive layer to produce a wafer stack. Then, dice cutting is performed on the obtained wafer stack at once to produce a stack of an adhesive layer-attached semiconductor chip.

The adhesive film for bonding a semiconductor of the present invention has high transparency, and therefore, use of the adhesive film facilitates recognition of a cutting plane line on the wafer surface and a pattern or position indication of a semiconductor chip with a camera. Consequently, according to the method for mounting a semiconductor chip of the present invention, a semiconductor device can be efficiently produced.

Moreover, according to the adhesive film for bonding a semiconductor of the present invention, a cured product of the adhesive layer has a low linear expansion coefficient to realize high bonding reliability. Therefore, according to the method for mounting a semiconductor chip of the present invention, it is possible to produce a semiconductor device having high bonding reliability.

A semiconductor chip-mounted product produced by the method for mounting a semiconductor chip of the present invention is another aspect of the present invention.

Effect of the Invention

According to the present invention, it is possible to provide an adhesive for bonding a semiconductor which has high transparency and facilitates recognition of a pattern or position indication on the occasion of semiconductor chip bonding.

MODES FOR CARRYING OUT THE INVENTION

The following examples illustrate the present invention in more detail. They are, however, by no means limitative of the scope of the invention.

EXAMPLES 1 TO 9, COMPARATIVE EXAMPLES 1 TO 5

(1) Production of Adhesive Film for Bonding Semiconductor

The materials listed below were added to methyl ethyl ketone in accordance with the formulations in Tables 1 and 2. Here, the solids concentration was adjusted to 50% by weight. The materials were mixed by stirring with a homo disper, so that an adhesive solution for bonding a semiconductor was prepared. The obtained adhesive solution was applied to a release-treated 25-µm-thick PET film as a substrate layer using an applicator (produced by Tester Sangyo Co., Ltd.). The applied solution was dried at 100° C. for five minutes, whereby an adhesive film for bonding a semiconductor which had a 40-µm-thick adhesive layer was obtained.

Then, another 25-µm-thick PET film was stacked on the adhesive layer side of the obtained adhesive film such that a specimen having a 40-µm-thick adhesive layer sandwiched by two 25-µm-thick PET films was obtained. The obtained specimen was placed in a haze meter (HM-150, produced by MURAKAMI COLOR RESEARCH LABORATORY CO., Ltd), and the haze value (%) was measured.

The obtained haze values (%) are shown in Table 1 and Table 2.

(Epoxy Resin)

HP-7200HH (dicyclopentadiene-type epoxy resin, produced by DIC)

EXA-4710 (naphthalene-type epoxy resin, produced by DIC)

(Epoxy Group-Containing Acrylic Resin)

SK-2-78 (2-methacryloyloxyethyl isocyanate adduct of a copolymer of 2-ethylhexyl acrylate, isobornyl acrylate, hydroxyethyl acrylate, and glycidyl methacrylate, molecular weight: 520,000, double bond equivalent: 0.9 meq/g, epoxy equivalent: 1650, produced by Shin-Nakamura Chemical Co., Ltd.)

(Curing Agent)

YH-309 (acid anhydride curing agent, produced by JER)

(Curing Accelerator)

Fujicure 7000 (imidazole compound in the liquid form at room temperature, produced by Fuji Kasei Co., Ltd.)

(Inorganic Filler)

(1) Filler A

SX009-MJF (phenyltrimethoxysilane surface-treated spherical silica, average particle size: 0.05 µm, produced by Admatechs)

(2) Filler B

SE-1050-SPT (phenyltrimethoxysilane surface-treated spherical silica, average particle size: 0.3 µm, produced by Admatechs)

SE-2050-SPJ (phenyltrimethoxysilane surface-treated spherical silica, average particle size: 0.5 µm, produced by Admatechs)

(3) Other Inorganic Fillers

SE-4050-SPE (phenyltrimethoxysilane surface-treated spherical silica, average particle size: 1 µm, produced by Admatechs)

(Others)

AC4030 (stress relaxation rubber-type polymer, produced by Ganz Chemical. Co., Ltd.)

(2) Mounting of Semiconductor Chip

A semiconductor wafer (silicon wafer) was prepared which was 20 cm in diameter and 700 µm in thickness, and had many square copper bumps with 40 µm (height)×100 µm (width)×100 µm (width) on the front face thereof at 400-µm intervals. The PET film protecting the adhesive layer was removed from the adhesive film, and the adhesive film was attached to the face with the copper bumps of the semiconductor wafer at 70° C. under vacuum (1 torr) using a vacuum laminator.

Subsequently, the obtained adhesive film-attached semiconductor wafer was put in a polishing apparatus. The semiconductor wafer was polished from the back side until the thickness thereof reached about 100 µm. At this time, the polishing was performed while water was sprayed to the semiconductor wafer in order to prevent the friction heat generated by the polishing from increasing the temperature of the semiconductor wafer. After the polishing, the semiconductor wafer was subjected to the chemical mechanical polishing (CMP) process including polishing with an alkali silica-dispersed aqueous solution, for mirror finishing.

The adhesive film-attached semiconductor wafer was removed from the polishing apparatus. Dicing tape "PE tape #6318-B" (produced by Sekisui Chemical Co., Ltd., thickness: 70 µm, base material: polyethylene, adhesive: 10 µm of rubber adhesive) was attached to the surface of the semiconductor wafer where the adhesive film was not attached, and the resulting product was mounted on a dicing frame. The substrate layer was removed from the adhesive layer of the adhesive film, and thereby a polished adhesive layer-attached semiconductor wafer was obtained.

The adhesive layer-attached semiconductor wafer was cut into 10 mm×10 mm chips using a dicing apparatus "DFD651" (produced by DISCO) at a feeding speed of 50 mm/sec. Thereby, semiconductor chips each having an adhesive layer were obtained.

The obtained semiconductor chips each having an adhesive layer were dried at 80° C. for 10 minutes in a hot air drying furnace. Each of the dried semiconductor chips was pressure-bonded to a substrate using a bonding machine (produced by Shibuya Kogyo Co., Ltd., DB-100) at a load of 0.15 MPa and a temperature of 230° C. for 10 seconds. The adhesive layer was cured at 190° C. for 30 minutes, whereby a semiconductor chip-mounted product was obtained.

(Evaluation)

The following evaluations were performed for the adhesive solutions for bonding a semiconductor, the adhesive films for bonding a semiconductor, and the semiconductor chip-mounted products obtained in the examples and comparative examples. Table 2 shows the results.

(1) Coating Property Evaluation (1-1) Solution Viscosity Measurement

The viscosity (mPa·s) of the adhesive solution for bonding a semiconductor at a rotational speed of 5 rpm was measured using an E type viscometer (VISCOMETER TV-22, produced by Toki Sangyo Co., Ltd., rotor used: φ48 mm, preset temperature: 25° C.)

(1-2) Appearance of Film

The condition of the adhesive film for bonding a semiconductor was observed visually. The adhesive film was evaluated as "o" if coating streaks were not observed and the appearance was good, and evaluated as "x" if coating streaks were observed.

(2) Automatic Recognition with Camera

The adhesive film for bonding a semiconductor was attached to the face of the semiconductor wafer having the copper bumps by a vacuum laminator (ATM-812, produced by Takatori Corporation), so that a test specimen was obtained. Ten test specimens were produced, and each was cut into pieces using an automatic dicing apparatus (DFT6361, produced by DISCO) and mounted on an automatic bonding device (FC3000S, produced by Toray Engineering Co., Ltd.). The resulting semiconductor chips were observed to determine whether or not the patterns thereon can be recognized by a camera.

The adhesive film was evaluated as "o" if the patterns on the semiconductor chips were recognized on all the 10 test specimens, "Δ" if the patterns on the semiconductor chips were recognized on 7 to 9 test specimens, and "x" if the patterns on the semiconductor chips were recognized on not more than 6 test specimens.

(3) Bonding Reliability Evaluation (3-1) Linear Expansion Coefficient Measurement The adhesive films for bonding a semiconductor were cured at 190° C. for 30 minutes, and the linear expansion coefficient of each of the obtained cured products was measured by a measuring apparatus "TMA/SS6000" (produced by Seiko Instruments) under the measurement conditions of tensile mode, 30 to 300° C. (5° C./min)×two cycles, and a chuck distance of 10 mm. The linear expansion coefficient (ppm) at a 40° C. contact point was read from the data of the second cycle, and the read value was set to α1.

(3-2) Reflow Resistance Test

The semiconductor chip-mounted product was left to stand at 120° C. and 85 RH % for 96 hours for moisture absorption, and passed through a solder reflow oven (preheat: 150° C.×100 seconds, peak reflow temperature: 260° C.) three times. Then, the number of the semiconductor chip-mounted products in which the semiconductor chips came off the substrates was determined.

The semiconductor chip-mounted product was tested using 20 of the same product, and evaluated as "o" if the number of the semiconductor chip-mounted products in which the coming off occurred was 0, "Δ" if the number was 1 to 3, and "x" if the number was 4 to 20.

TABLE 1

|  |  |  |  | Example 1 | Example 2 | Example 3 | Example 4 | Example 5 | Example 6 | Example 7 | Example 8 | Example 9 |
|---|---|---|---|---|---|---|---|---|---|---|---|---|
| Adhesive layer (parts by weight) | Epoxy resin | dicyclopentadiene-type | HP-7200HH | 84 | 84 | 84 | 84 | 84 | 84 | 84 | 84 | 84 |
|  |  | Naphthalene-type | EXA-4710 | 10 | 10 | 10 | 10 | 10 | 10 | 10 | 10 | 10 |
|  |  | Epoxy group-containing acrylic resin | SK-2-78 | 30 | 30 | 30 | 30 | 30 | 30 | 30 | 30 | 30 |
|  |  | Curing agent | YH-309 | 50 | 50 | 50 | 50 | 50 | 50 | 50 | 50 | 50 |
|  |  | Curing accelerator | Fujicure 7000 | 7 | 7 | 5 | 5 | 5 | 5 | 5 | 5 | 5 |
|  | Inorganic filler | Filler A | SX009-MJF | 20 | 40 | 60 | 80 | 100 | 120 | 120 | 48 | 120 |
|  |  | Filler B | SE-1050-SPT | 180 | 160 | 140 | 120 | 100 | 80 | — | 72 | 180 |
|  |  |  | SE-2050-SPJ | — | — | — | — | — | — | 80 | — | — |
|  |  | Others | SE-4050-SPE | — | — | — | — | — | — | — | — | — |
|  |  | Othres |  AC4030 | 5 | 5 | 5 | 5 | 5 | 5 | 5 | 5 | 5 |
|  |  | Filler A/Filler B |  | 1/9 | 2/8 | 3/7 | 4/6 | 5/5 | 6/4 | 6/4 | 4/6 | 4/6 |
|  |  | Inorganic filler content (% by weight) |  | 52 | 52 | 52 | 52 | 52 | 52 | 52 | 39 | 62 |
|  |  | Haze value (%) |  | 65.6 | 62.2 | 59.6 | 57.5 | 54.4 | 52.6 | 67.5 | 53.1 | 58.8 |
| Evaluation | Coating property | Adhesive solution viscosity (mPa·s) |  | 76 | 84 | 164 | 278 | 440 | 620 | 632 | 218 | 394 |
|  |  | Appearance of film |  | ○ | ○ | ○ | ○ | ○ | ○ | ○ | ○ | ○ |
|  |  | Automatic recognition with camera |  | Δ | ○ | ○ | ○ | ○ | ○ | Δ | ○ | ○ |
|  | Bonding reliability | Linear expansion coefficient (α1)(ppm) |  | 37 | 39 | 36 | 38 | 37 | 35 | 37 | 46 | 32 |
|  |  | Reflow resistance test |  | ○ | ○ | ○ | ○ | ○ | ○ | ○ | Δ | Δ |

TABLE 2

|  |  |  |  | Comparative Example 1 | Comparative Example 2 | Comparative Example 3 | Comparative Example 4 | Comparative Example 5 |
|---|---|---|---|---|---|---|---|---|
| Adhesive layer (parts by weight) | Epoxy resin | dicyclopentadiene-type | HP-7200HH | 84 | 84 | 84 | 84 | 84 |
|  |  | Naphthalene-type | EXA-4710 | 10 | 10 | 10 | 10 | 10 |
|  |  | Epoxy group-containing acrylic resin | SK-2-78 | 30 | 30 | 30 | 30 | 30 |
|  |  | Curing agent | YH-309 | 50 | 50 | 50 | 50 | 50 |
|  |  | Curing accelerator | Fujicure 7000 | 7 | 7 | 7 | 7 | 7 |
|  | Inorganic filler | Filler A | SX009-MJF | — | 140 | 120 | 24 | 180 |
|  |  | Filler B | SE-1050-SPT | 200 | 60 | — | 48 | 270 |
|  |  |  | SE-2050-SPJ | — | — | — | — | — |
|  |  | Others | SE-4050-SPE | — | — | 80 | — | — |
|  |  | Othres | AC4030 | 5 | 5 | 5 | 5 | 5 |
|  |  | Filler A/Filler B |  | 0/10 | 7/3 | — | 4/6 | 4/6 |
|  |  | Inorganic filler content (% by weight) |  | 52 | 52 | 52 | 28 | 71 |
|  |  | Haze value (%) |  | 77 | 50.4 | 82.2 | 52.6 | 63.5 |
| Evaluation | Coating property | Adhesive solution viscosity (mPa·s) |  | 55 | 856 | 678 | 116 | 457 |
|  |  | Appearance of film |  | ○ | x | ○ | ○ | ○ |
|  |  | Automatic recognition with camera |  | x | ○ | x | ○ | Δ |
|  | Bonding reliability | Linear expansion coefficient (α1)(ppm) |  | 39 | 37 | 40 | 61 | 24 |
|  |  | Reflow resistance test |  | ○ | ○ | ○ | x | x |

EXAMPLES 10 TO 20, COMPARATIVE EXAMPLES 6 to 8

In accordance with the formulations shown in Tables 3 and 4, the following materials were mixed by stirring with a homo disper, so that an adhesive for bonding a semiconductor was prepared. The difference in the refractive index between the epoxy resin and the inorganic filler is shown in Tables 3 and 4.

(Epoxy Resin)

Dicyclopentadiene-type epoxy resin (HP-7200HH, produced by DIC)

Bisphenol A-type epoxy resin (1004AF, produced by Japan Epoxy Resin)

Naphthalene-type epoxy resin (compound in which $R^1$ and $R^2$ are H, and m and n are 1 in the above Formula (1), EXA-4710, produced by DIC)

(Photocurable Compound)

Acrylic resin having photocurable functional groups and thermosetting functional groups (2-methacryloyloxyethyl isocyanate adduct of a copolymer of 2-ethylhexyl acrylate, isobornyl acrylate, hydroxyethyl acrylate, and glycidyl methacrylate, molecular weight: 520,000, double bond equivalent: 0.9 meq/g, epoxy equivalent: 1650, SK-2-78, produced by Shin-Nakamura Chemical Co., Ltd.)

(Curing Agent)

Acid anhydride (YH-307, produced by Japan Epoxy Resin)

(Photopolymerization Initiator)

Photoradical precursor (Esacure 1001, produced by Lamberti)

(Inorganic Filler)

Silica-titania complex oxide (produced by Tokuyama Corporation, TSP 0452, average particle size: 0.4 μm)

Pyrex (registered trademark) glass 1 (produced by Unitika, Ltd., UBS 0010E, average particle size: 4 μm)

Pyrex (registered trademark) glass 2 (produced by Nippon Frit Co., Ltd., CF0033-05, average particle size: 4 μm)

Spherical silica 1 (produced by Tokuyama Corporation, 0.4SSO4, average particle size: 0.4 μm)

Spherical silica 2 (produced by Admatechs, SE4050M0, average particle size: 1 μm)

Spherical silica 3 (produced by Tokuyama Corporation, UF305, average particle size: 3 μm)

(Others)

Imidazole compound (2MA-OK, produced by Shikoku Chemicals Corp.)

Stress relaxation rubber-type polymer (AC4030, produced by Ganz Chemical. Co., Ltd.)

Imidazole silane coupling agent (SP-1000, produced by Nikko Materials Co., Ltd.)

(Evaluation)

Adhesive compositions obtained by diluting the adhesives for bonding a semiconductor obtained in the examples and comparative examples with solvents each were applied to a release-treated PET film with an applicator (produced by Tester Sangyo Co., Ltd.). The adhesive compositions were dried, so that 40 μm-thick adhesive films as reference products were obtained.

The obtained adhesive films were used for the following evaluations. Tables 3 and 4 show the results.

(1) Haze Value Measurement

Each of the obtained 40-μm-thick adhesive film was sandwiched by two 25-μm-thick PET films, and thereby a test specimen was obtained. The obtained test specimen was placed in a haze meter (HM-150, produced by MURAKAMI COLOR RESEARCH LABORATORY CO., Ltd), and the haze value (%) was measured. The test specimen was evaluated as "o" if the haze value was not lower than 0% and less than 60%, and "x" if the haze value was not lower than 60% and not higher than 100%.

(2) Evaluation of Automatic Recognition with Camera

The obtained 40-μm-thick adhesive film was attached to the semiconductor wafer by a vacuum laminator (ATM-812, produced by Takatori Corporation), so that a test specimen was obtained. Ten test specimens were produced, and each was cut into pieces using an automatic dicing apparatus (DFT6361, produced by DISCO) and mounted on an automatic bonding device (FC3000S, produced by Toray Engineering Co., Ltd.). The resulting semiconductor chips were observed to determine whether or not the patterns thereon can be recognized by a camera. The adhesive film was evaluated as "o" if the patterns on the semiconductor chips were recognized on all the 10 test specimens, "Δ" if the patterns on the semiconductor chips were recognized on 7 to 9 test specimens, and "x" if the patterns on the semiconductor chips were recognized on not more than 6 test specimens.

TABLE 3

| | | | Example 10 | Example 11 | Example 12 | Example 13 | Example 14 | Example 15 | Example 16 |
|---|---|---|---|---|---|---|---|---|---|
| Adhesive for bonding semiconductor (parts by weight) | Epoxy resin | dicyclopentadiene-type epoxy resin | 80 | 80 | 80 | 80 | 80 | 80 | 80 |
| | | bisphenol A-type epoxy resin | 10 | 10 | 10 | 10 | 10 | 10 | 10 |
| | | Naphthalene-type epoxy resin | 10 | 10 | 10 | 10 | 10 | 10 | 10 |
| | Photocurable compound | Acrylic resin having photocurable functional group and thermosetting functional group | 35 | 35 | 35 | 35 | 35 | 35 | 35 |
| | Photopolymerization initiator | Photoradical precursor | 1 | 1 | 1 | 1 | 1 | 1 | 1 |
| | Curing agent | Acid anhydride | 50 | 50 | 50 | 50 | 50 | 50 | 50 |
| | | Imidazole compound (2MAOKDS) | 5 | 5 | 5 | — | — | — | — |
| | | Liquid imidazole compound (Fujicure 7000) | — | — | — | 5 | 5 | 5 | 5 |
| | | Stress relaxation rubber-type polymer | 5 | 5 | 5 | 5 | 5 | 5 | 5 |
| | | Imidazole silane coupling agent | 2 | 2 | 2 | 2 | 2 | 2 | 2 |
| | Inorganic filler | Silica-titania complex oxide | 50 | — | — | 50 | — | — | 100 |
| | | Pyrex glass 1 | — | 50 | — | — | 50 | — | — |
| | | Pyrex glass 2 | — | — | 50 | — | — | 50 | — |
| | | Spherical silica 1 | — | — | — | — | — | — | — |
| | | Spherical silica 2 | — | — | — | — | — | — | — |
| | | Spherical silica 3 | — | — | — | — | — | — | — |
| | Difference in reflection index between epoxy resin and inorganic filler | | 0.05 | 0.05 | 0.09 | 0.05 | 0.05 | 0.09 | 0.05 |
| Evaluation | Haze value (measured value (%)) | | ○ (38) | ○ (40) | ○ (53) | ○ (22) | ○ (26) | ○ (30) | ○ (35) |
| | Automatic recognition with camera | | ○ | ○ | ○ | ○ | ○ | ○ | ○ |

TABLE 4

| | | | Example 17 | Example 18 | Example 19 | Example 20 | Comparative Example 6 | Comparative Example 7 | Comparative Example 8 |
|---|---|---|---|---|---|---|---|---|---|
| Adhesive for bonding semi-conductor (parts by weight) | Epoxy resin | dicyclopentadiene-type epoxy resin | 80 | 80 | 80 | 80 | 80 | 80 | 80 |
| | | bisphenol A-type epoxy resin | 10 | 10 | 10 | 10 | 10 | 10 | 10 |
| | | Naphthalene-type epoxy resin | 10 | 10 | 10 | 10 | 10 | 10 | 10 |
| | Photocurable compound | Acrylic resin having photocurable functional group and thermosetting functional group | 35 | 35 | 35 | 35 | 35 | 35 | 35 |
| | Photopolymerization initiator | Photoradical precursor | 1 | 1 | 1 | 1 | 1 | 1 | 1 |
| | Curing agent | Acid anhydride | 50 | 50 | 50 | 50 | 50 | 50 | 50 |
| | | Imidazole compound (2MAOKDS) | — | — | — | — | 5 | 5 | 5 |
| | | Liquid imidazole compound (Fujicure 7000) | 5 | 5 | 10 | 15 | — | — | — |
| | | Stress relaxation rubber-type polymer | 5 | 5 | 5 | 5 | 5 | 5 | 5 |
| | | Imidazole silane coupling agent | 2 | 2 | 2 | 2 | 2 | 2 | 2 |
| | Inorganic filler | Silica-titania complex oxide | 200 | 300 | 200 | 200 | — | — | — |
| | | Pyrex glass 1 | — | — | — | — | — | — | — |
| | | Pyrex glass 2 | — | — | — | — | — | — | — |
| | | Spherical silica 1 | — | — | — | — | 50 | — | — |
| | | Spherical silica 2 | — | — | — | — | — | 50 | — |
| | | Spherical silica 3 | — | — | — | — | — | — | 50 |
| Difference in reflection index between epoxy resin and inorganic filler | | | 0.05 | 0.05 | 0.05 | 0.05 | 0.2 | 0.2 | 0.2 |
| Evaluation | Haze value (measured value (%)) | | ○ (48) | ○ (55) | ○ (49) | ○ (50) | x (77) | x (88) | x (89) |
| | Automatic recognition with camera | | ○ | ○ | ○ | ○ | A | x | x |

REFERENCE EXAMPLES 1 TO 4

The materials listed below were added to methyl ethyl ketone in accordance with the formulations in Table 5 until the solids concentration reached 50% by weight. The materials were mixed by stirring with a homo disper, so that a thermosetting resin composition solution was prepared.
(Epoxy Resin)
 HP-7200HH (dicyclopentadiene-type epoxy resin, produced by DIC)
 EXA-4710 (naphthalene-type epoxy resin, produced by DIC)
(Epoxy Group-Containing Acrylic Resin)
 SK-2-78 (2-methacryloyloxyethyl isocyanate adduct of a copolymer of 2-ethylhexyl acrylate, isobornyl acrylate, hydroxyethyl acrylate, and glycidyl methacrylate, molecular weight: 520,000, double bond equivalent: 0.9 meq/g, epoxy equivalent: 1650, produced by Shin-Nakamura Chemical Co., Ltd.)
(Acid Anhydride)
 YH-306 (acid anhydride without a bicyclo skeleton, produced by JER)
 YH-309 (acid anhydride with a bicyclo skeleton, produced by JER)
 HNA-100 (acid anhydride with a bicyclo skeleton, produced by New Japan Chemical Co., Ltd.)
(Imidazole Compound)
 2MAOK-DS (imidazole compound in the solid form at room temperature, produced by Shikoku Chemicals Corporation)
 Fujicure 7000 (imidazole compound in the liquid form at room temperature, produced by Fuji Kasei Co., Ltd.)
(Others)
 MT-10 (fumed silica, produced by Tokuyama Corporation)
 AC4030 (stress relaxation rubber-type polymer, produced by Ganz Chemical. Co., Ltd.)

(Evaluation)

The thermosetting resin composition solution obtained in the reference example was applied to a release-treated PET film with an applicator (produced by Tester Sangyo Co., Ltd.). The solution was dried at 100° C. for five minutes, so that a 40-μm-thick adhesive film was obtained. The following evaluations were performed on the obtained adhesive film.

Table 5 shows the results.
(1) Storage Stability

The storage stability was evaluated by measuring the gel fraction (% by weight) after two-week storage at room temperature in the following procedure.

The obtained adhesive film was stored at room temperature for two weeks, a 50 mm×100 mm plane rectangular test specimen was cut out, and the specimen was weighed. The test specimen was put into ethyl acetate to be immersed at room temperature for 24 hours. The test specimen was taken out of the ethyl acetate, and dried at 110° C. for one hour. The dried test specimen was weighed, and the gel fraction (% by weight) was calculated from the following equation (1).

$$\text{Gel fraction (\% by weight)} = W2/W1 \times 100 \tag{1}$$

In equation (1), W1 represents the weight of the test specimen before the immersion, and W2 represents the weight of the test specimen after the immersion and drying. The test specimen was evaluated as "o" if the gel fraction was lower than 10% by weight, and "x" if the gel fraction was not lower than 10% by weight.
(2) Heat Stability A portion of the obtained adhesive film was sampled, and subjected to DSC measurement under the measurement conditions of 30 to 300° C. (5° C./min) and $N_2$=50 ml/min using a measurement device "DSC 6220" (produced by Seiko Instruments).

The initiation of the exothermic peak was observed. The adhesive film was evaluated as "o" if the exothermic starting temperature was not lower than 100° C., and "x" if the exothermic starting temperature was lower than 100° C.

TABLE 5

| | | | | Reference Example 1 | Reference Example 2 | Reference Example 3 | Reference Example 4 |
|---|---|---|---|---|---|---|---|
| Thermosetting resin composition (parts by weight) | Epoxy resin | dicyclopentadiene-type | HP-7200HH | 94 | 94 | 94 | 94 |
| | | Naphthalene-type | EXA-4710 | 10 | 10 | 10 | 10 |
| | Epoxy group-containing acrylic resin | | SK-2-78 | 25 | 25 | 25 | 25 |
| | Acid anhydride | Without bicyclo skeleton | YH-306 | — | — | 44 | — |
| | | With bicyclo skeleton | YH-309 | 44 | — | — | 44 |
| | | | HNA-100 | — | 44 | — | — |
| | Imidazole compound | Solid at room temperatures | 2MA-OK-DS | — | — | — | 7 |
| | | Liquid at room temperatures | Fujicure 7000 | 7 | 7 | 7 | — |
| | Others | | MT-10 | 5 | 5 | 5 | 5 |
| | | | AC4030 | 5 | 5 | 5 | 5 |
| Evaluation | Storage stability | Gel fraction (% by weight) in two weeks | | 4 | 9 | 26 | 5 |
| | | Evaluation | | ○ | ○ | x | ○ |
| | Heat stability | Exothermic starting temperature (° C.) | | 121 | 110 | 66 | 162 |
| | | Evaluation | | ○ | ○ | x | ○ |

Industrial Applicability

The present invention can provide an adhesive for bonding a semiconductor which has high transparency and facilitates recognition of a pattern or position indication on the occasion of semiconductor chip bonding.

The invention claimed is:

1. An adhesive for bonding a semiconductor containing:

an epoxy resin;

an inorganic filler; and a curing agent, wherein the amount of the inorganic filler in the adhesive is 30 to 70% by weight, the inorganic filler contains a filler A having an average particle size of less than 0.1 μm and a filler B having an average particle size of greater than 0.1 μm and less than 1 μm, and the weight ratio of the filler A to the filler B is 1/9 to 6/4.

2. The adhesive for bonding a semiconductor according to claim 1, wherein the inorganic filler is a spherical silica.

3. An adhesive for bonding a semiconductor containing:

an epoxy resin;

an inorganic filler; and a curing agent, wherein difference in refractive index is less than 0.1 between the epoxy resin and the inorganic filler.

4. The adhesive for bonding a semiconductor according to claim 3, wherein the inorganic filler is at least one selected from the group consisting of oxides of silicon, titanium, aluminum, calcium, boron, magnesium and zirconium, and composites of these.

5. The adhesive for bonding a semiconductor according to claim 1, wherein the inorganic filler is surface treated with a coupling agent.

6. The adhesive for bonding a semiconductor according to claim 1, wherein the curing agent is an acid anhydride having a bicyclo skeleton and the adhesive further contains as a curing accelerator an imidazole compound that is liquid at room temperature.

7. The adhesive for bonding a semiconductor according to claim 6, wherein the acid anhydride having a bicyclo skeleton is a compound having a structure represented by Formula (a):

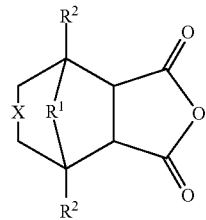

wherein X represents a linking group of a single or double bond, $R^1$ represents a methylene or ethylene group, and $R^2$ and $R^3$ each represent a hydrogen atom, a halogen group, an alkoxy group, or a hydrocarbon group.

8. The adhesive for bonding a semiconductor according to claim 1, further containing a polymer compound having a functional group reactive with an epoxy resin.

9. An adhesive film for bonding a semiconductor comprising an adhesive layer formed of the adhesive for bonding a semiconductor according to claim 1, and a substrate layer.

10. A method for mounting a semiconductor chip with use of an adhesive film for bonding a semiconductor having an adhesive layer formed of the adhesive for bonding a semiconductor according to claim 1, and a substrate layer, the method comprising the steps of:

(1) laminating an adhesive layer of the adhesive film and a protruding electrode-forming face of a wafer that has a protruding electrode formed on a front face;

(2) grinding the wafer fixed to the adhesive film from the back;

(3) removing a substrate layer from the adhesive film laminated on the ground wafer to obtain an adhesive layer-attached wafer;

(4) allowing a camera to recognize a cutting plane line on the front face of the adhesive layer-attached wafer automatically and then dice cutting the adhesive layer-attached wafer along the cutting plane line to produce an adhesive layer-attached semiconductor chip; and (5) allowing a camera to recognize a pattern or position indication of the adhesive layer-attached semiconductor chip and a pattern or position indication of a substrate or another semiconductor chip automatically to perform alignment and then adhering the adhesive layer-attached semiconductor chip to the substrate or the another semiconductor chip via the adhesive layer for mounting the semiconductor chip.

11. The method for mounting a semiconductor chip according to claim 10 further comprising the step of (6) completely curing the adhesive layer by heating after mounting the semiconductor chip in the step (5).

12. A semiconductor device produced by the method for mounting a semiconductor chip according to claim 10.

13. The adhesive for bonding a semiconductor according to claim 2, wherein the inorganic filler is surface treated with a coupling agent.

14. The adhesive for bonding a semiconductor according to claim 3, wherein the inorganic filler is surface treated with a coupling agent.

15. The adhesive for bonding a semiconductor according to claim 4, wherein the inorganic filler is surface treated with a coupling agent.

16. The adhesive for bonding a semiconductor according to claim 2, wherein the curing agent is an acid anhydride having a bicyclo skeleton and the adhesive further contains as a curing accelerator an imidazole compound that is liquid at room temperature.

17. The adhesive for bonding a semiconductor according to claim 3, wherein the curing agent is an acid anhydride having a bicyclo skeleton and the adhesive further contains as a curing accelerator an imidazole compound that is liquid at room temperature.

18. The adhesive for bonding a semiconductor according to claim 4, wherein the curing agent is an acid anhydride having a bicyclo skeleton and the adhesive further contains as a curing accelerator an imidazole compound that is liquid at room temperature.

19. The adhesive for bonding a semiconductor according to claim 5, wherein the curing agent is an acid anhydride having a bicyclo skeleton and the adhesive further contains as a curing accelerator an imidazole compound that is liquid at room temperature.

20. The adhesive for bonding a semiconductor according to claim 2, further containing a polymer compound having a functional group reactive with an epoxy resin.

\* \* \* \* \*